United States Patent [19]
Marietta et al.

[11] Patent Number: 5,848,025
[45] Date of Patent: Dec. 8, 1998

[54] METHOD AND APPARATUS FOR CONTROLLING A MEMORY DEVICE IN A PAGE MODE

[75] Inventors: Bryan D. Marietta; Laura Weber; Michael C. Becker, all of Austin, Tex.

[73] Assignee: Motorola, Inc., Schaumburg, Ill.

[21] Appl. No.: 885,434

[22] Filed: Jun. 30, 1997

[51] Int. Cl.[6] .................................................. G11C 8/00
[52] U.S. Cl. ........................................................ 365/238.5
[58] Field of Search .............................. 365/238.5, 194, 365/230.3

[56] References Cited

U.S. PATENT DOCUMENTS 5,335,336  8/1994  Kametani ............................. 365/238.5

Primary Examiner—David Nelms
Assistant Examiner—David Lam
Attorney, Agent, or Firm—Lee E. Chastain

[57] ABSTRACT

A method (600, 700) and apparatus (402) for controlling a memory device, such as a synchronous dynamic random access memory (404), includes a user-programmable register containing a new parameter, PRECHARGE DELAY TIME. A memory controller (402) uses the parameter to set a minimum limit through which each page is kept open after an initial access. Subsequent access to the same page cause the controller to reset the limit, thereby extending the open page. Accesses to different pages, refresh operations, and maximum row address strobe parameters can force the page closed. A user can tune the PRECHARGE DELAY TIME to keep pages open through the time period in which it is likely that additional accesses will be to the same page. Conversely, open pages can be closed after that time period is exceeded. In both cases, the memory device will be ready for a subsequent access with minimum latency.

16 Claims, 5 Drawing Sheets

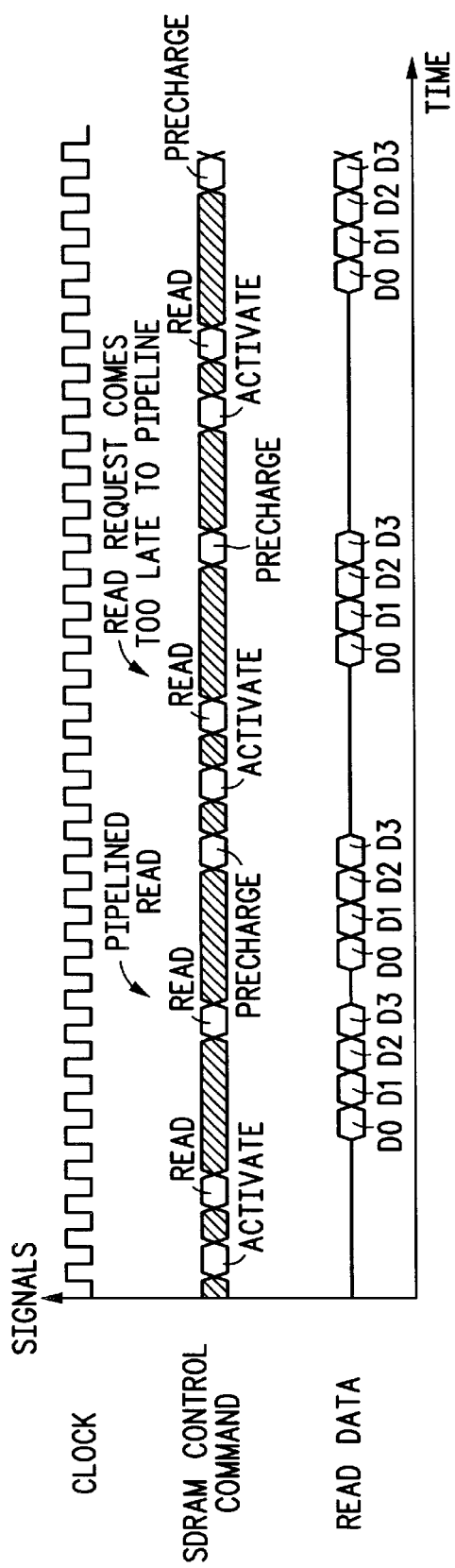
FIG. 1 —PRIOR ART—
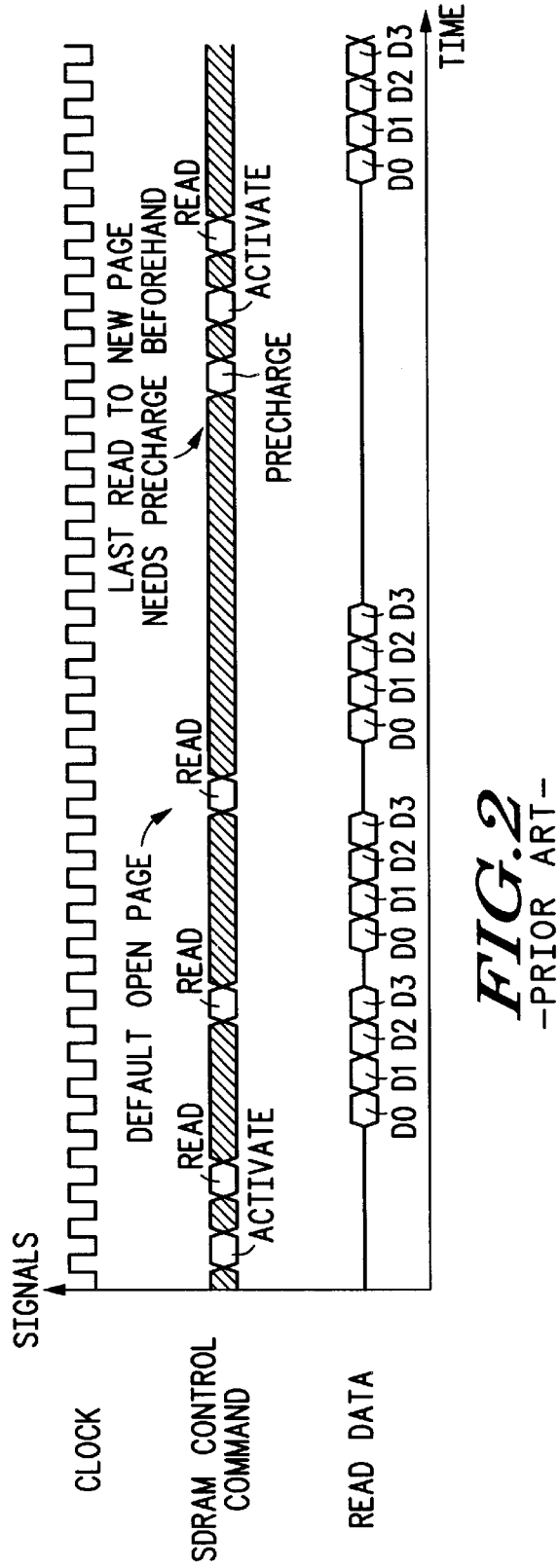
FIG. 2 —PRIOR ART—

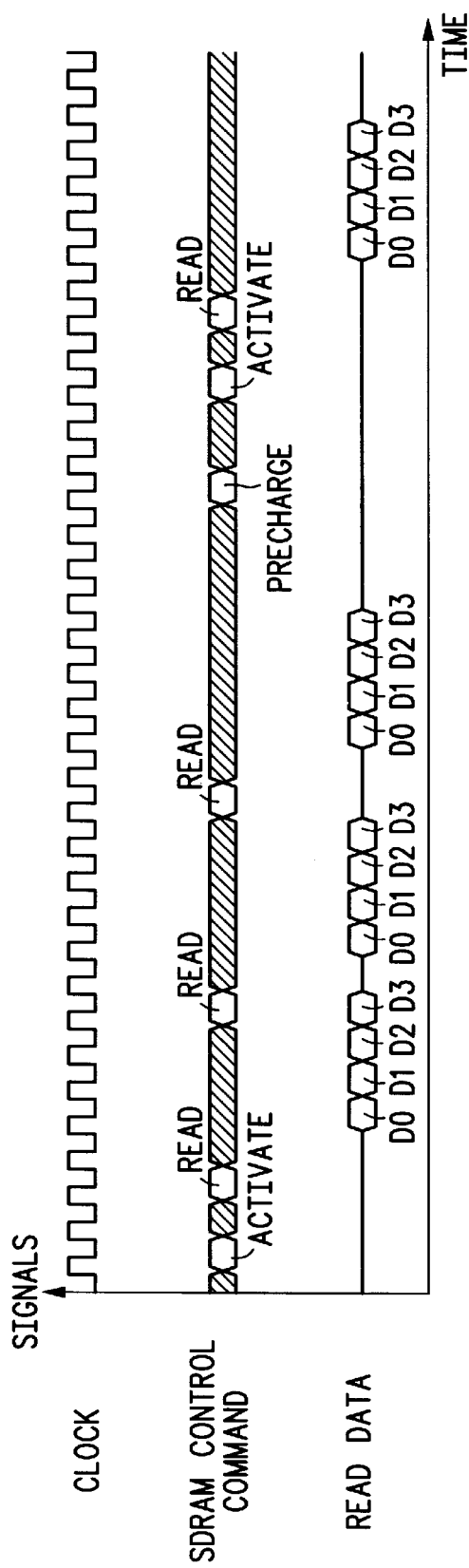

METHOD AND APPARATUS FOR CONTROLLING A MEMORY DEVICE IN A PAGE MODE

FIELD OF THE INVENTION

The present invention generally relates to electronic memory systems, and more specifically to a method and apparatus for controlling such a device in a page mode of operation.

BACKGROUND OF THE INVENTION

Memory systems naturally introduce latencies or "delays" when they accept or provide data to a data processor, microcontroller, digital signal processor, etc. These latencies are compounded in systems in which memory addresses are multiplexed over a smaller address bus over time. In a synchronous dynamic random access memory (SDRAM), there is a delay associated with the row address and with the column address. The semiconductor industry has developed a "page mode" of operation to eliminate the row address delay when accesses are to the same row. Typically, a single row contains enough data to satisfy many different column addresses. The set of bit cells within a single row are referred to as a page of data. At least two page modes are known in the art.

FIG. 1 depicts a timing diagram illustrating a first page mode of operation known in the art. Here, four burst read accesses are applied to an SDRAM by an SDRAM controller. The first three read instructions are to the same page. The fourth is to a different page. It should be noted that the operation of this first page mode is substantially similar for write operation.

The SDRAM controller initiates a first read access by sending an ACTIVATE command and a row address (not shown) to the SDRAM. The combination of the ACTIVATE command and the row address couples the specified row to the sense and output circuitry of the DRAM. These steps are known as "opening the page." Later, the SDRAM controller sends a read command and a column address (not shown) to the SDRAM. These steps select which column of the opened page are output. In the depicted embodiment, the SDRAM outputs four consecutive data beats beginning with the specified address for each access. These data beats are labeled D0, D1, D2, and D3. The interval between the ACTIVATE command and the READ command is called the activate-to-read delay. The activate-to-read delay is specified by the manufacturer of the SDRAM. The interval between the READ command and the first data beat is called the column address strobe (CAS) latency. The CAS latency is specified by the manufacturer of the SDRAM.

In this first known page mode, the SDRAM controller "closes the page" simultaneously with the last data beat of each operation if there are no pending accesses to the same page. The SDRAM controller closes the page by issuing a PRECHARGE command. The SDRAM controller determines if consecutive operations are accesses to the same page by comparing their row addresses. In this example, the second read operation in FIG. 1 arrives before the last data beat of the first read operation. Consequently, the SDRAM controller keeps the page open after the last data beat of the first read operation and issues a second READ. This pipelined methodology eliminates the activate-to-read delay in the second operation. Conversely, in this example, the third read operation arrives after the last data beat of the second read. Consequently, the SDRAM controller has already closed the page by issuing a PRECHARGE command. In this third case, the SDRAM controller must wait until the PRECHARGE command is completed. This delay is referred to as the precharge-to activate delay. It is also specified by the manufacturer of the SDRAM. Afterwards, the SDRAM controller may start a read operation anew. As described above, each new read operation also entails an activate-to-read delay.

In the fourth read operation, it should be noted that the PRECHARGE command was completed at the end of the third READ operation. Therefore, the precharge-to activate delay is hidden in the fourth read operation. To eliminate the activate-to-read delay, this first known mode of operation requires that a subsequent operation be received prior the completion of the concurrent operation.

FIG. 2 depicts a timing diagram illustrating a second page mode of operation known in the art. Again, four burst read accesses are applied to an SDRAM by an SDRAM controller. The first three read instructions are to the same page. The fourth is to a different page.

The SDRAM controller initiates the first read access as described above. The first read operation also entails an activate-to-read delay and a CAS latency delay. In this second known page mode, the SDRAM controller keeps the page open for as long as possible. The manufacturer of the SDRAM specifies a parameter "TRAS" that defines the maximum interval through which a row may be opened. Beyond this time, data integrity may be compromised. The page is already open for the second, third and fourth read operation. In the second and third read operations, the SDRAM controller avoids the activate-to-read delay. However, the wrong page is open for the fourth read. The SDRAM controller must close the current page and open the correct page. The SDRAM controller closes the current page by issuing a PRECHARGE command and by waiting a precharge-to-activate delay period. The SDRAM controller starts a read operation anew. As described above, each new read operation also entails an activate-to-read delay.

Although the second and third read commands occurred without a activate-to-read delay, the fourth incurred a precharge-to-activate delay in addition to the required activate-to-read delay.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which:

FIG. 1 depicts a timing diagram illustrating a first page mode of operation known in the art;

FIG. 2 depicts a timing diagram illustrating a second page mode of operation known in the art;

FIG. 3 depicts a timing diagram illustrating a page mode of operation according to the present invention;

FIG. 5 depicts a conceptual representation of the user programmable timing parameters of the memory system illustrated in FIG. 4;

DETAILED DESCRIPTION OF A PREFERRED EMBODIMENT

FIG. 3 depicts a timing diagram illustrating a page mode of operation according to the present invention. The method and apparatus of the present invention describes a page mode of operation in which a page is maintained in an open state after access thereto for a programmable period of time. The period of time may be selected by the user to ensure that a page is kept open so that accesses to it within the programmed time period are not adversely impacted. In these cases, the activate-to-read delays are omitted. Further, the period of time may also be selected to ensure that the page is closed before probable accesses to a different page are efficiently processed. In these latter cases, the precharge-to-activate delays are avoided.

Continuing with FIG. 3, the read examples described above in connection with FIGS. 1 and 2 are also applied to the page mode of the present invention. As in FIGS. 1 and 2, the first three read operations are to the same page. The fourth read operation is to a different page.

Figure 4:
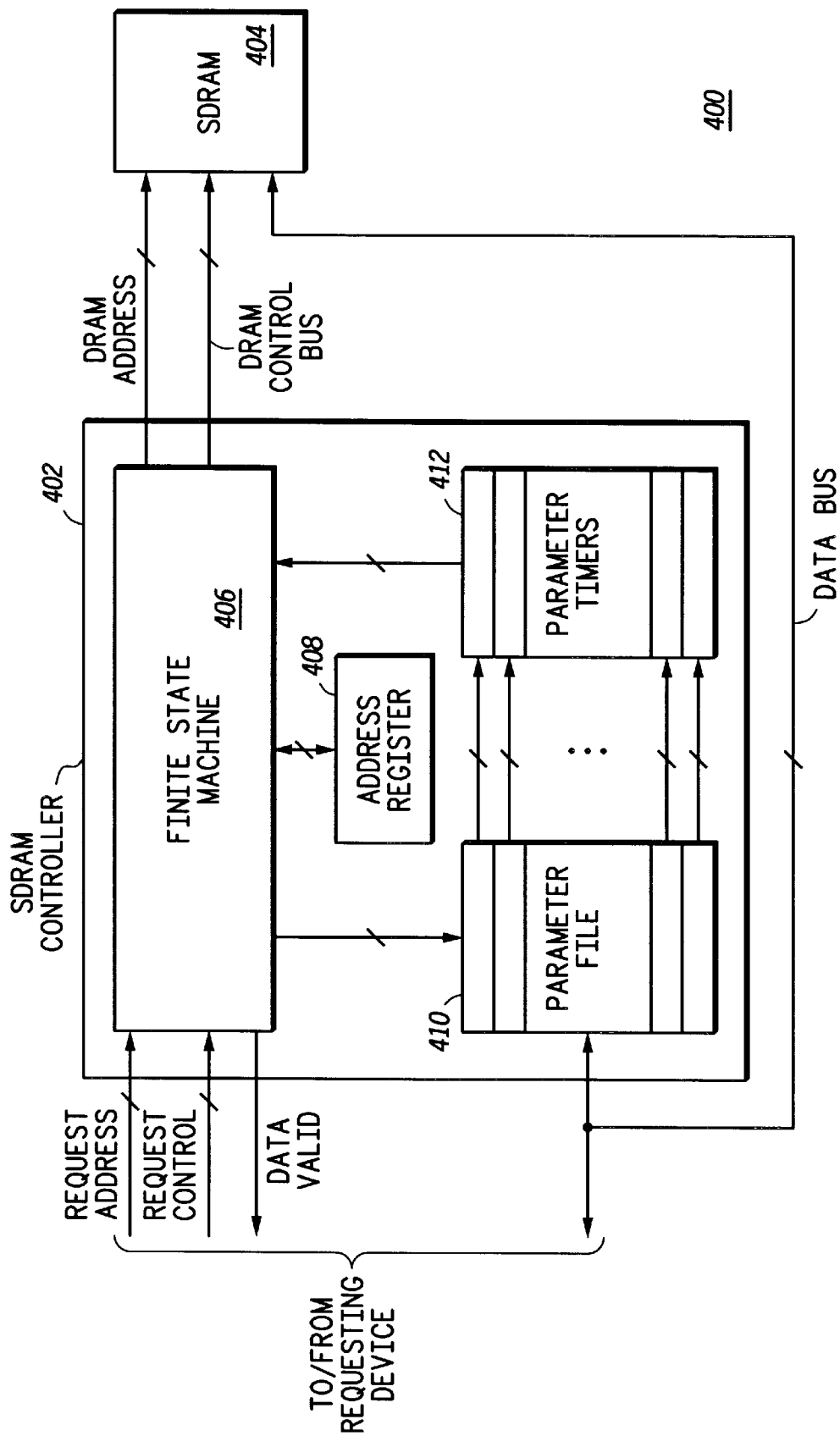
FIG. 4 depicts a memory system constructed in accordance with the present invention.

The SDRAM controller (depicted in FIG. 4) initiates a first read access by sending an ACTIVATE command and a row address (not shown) to the SDRAM (depicted in FIG. 4). The combination of the ACTIVATE command and the row address couples the specified row to the sense and output circuitry of the DRAM, opening the page. Later, the SDRAM controller sends a read command and a column address (not shown) to the SDRAM. These steps select which column of the opened page are output. The SDRAM outputs four consecutive data beats beginning with the specified address for each access. These data beats are labeled D0, D1, D2, and D3. The interval between the ACTIVATE command and the READ command is called the activate-to-read delay. The activate-to-read delay is specified by the manufacturer of the SDRAM. The interval between the READ command and the first data beat is called the column address strobe (CAS) latency. The CAS latency is specified by the manufacturer of the SDRAM.

According to the present invention, the SDRAM controller keeps the page open for an interval defined by a user programmable register, PRECHARGE DELAY TIME. In the depicted example, PRECHARGE DELAY TIME equals four clock cycles. Further, a timer maintaining the interval is reloaded with the full PRECHARGE DELAY TIME value whenever an access is made to the open page, thereby extending the interval. The page is already open for the second and third read operations, avoiding the activate-to-read delays in each operation. However, the fourth read operation occurs more than four clock cycles after the third read operation. Therefore, the page is closed prior to the fourth operation by the issuance of a PRECHARGE command four cycles after the last data beat of the third operation. The SDRAM controller may begin a fourth operation without waiting for the precharge-to activate delay.

FIG. 4 depicts a memory system 400 constructed in accordance with the present invention. Memory system 400 comprises an SDRAM controller 402 and an SDRAM 404. SDRAM controller 402 receives a REQUEST ADDRESS, REQUEST CONTROL signals, and a bi-directional DATA BUS from a requesting device (not shown). A requesting device may be a data processor, a microcontroller, a digital signal processor, a direct memory access (DMA) device, etc. SDRAM controller 402 outputs a DATA VALID signal to the requesting device. SDRAM controller 402 outputs a DRAM ADDRESS and DRAM CONTROL BUS to SDRAM 404. SDRAM 404 is also bi-directionally coupled to the DATA BUS.

SDRAM controller 402 itself comprises a finite state machine (FSM) 406, an address register 408, a parameter file 410 and parameter timers 412. FSM 406 receives the inputs REQUEST ADDRESS and REQUEST CONTROL, generates the outputs DRAM ADDRESS and DRAM CONTROL BUS. FSM 406 is bi-directionally coupled to address register 408. FSM 406 generates the internal control signals LOAD PARAMETERS and LOAD TIMERS, coupled to parameter file 410 and to parameter timers 412, respectively. Parameter file 410 receives the input DATA BUS. Parameter timers 412 generate the multi-bit control signals TIME OUT coupled to FSM 406. There is a corresponding timer for each parameter in parameter file 410. In other embodiments, some timers may perform multiple timing functions with multiple parameter values. Similarly, there may be multiple timers for a single parameter, especially if more than one page may be open at any particular time.

The operation of FSM 406 is described below in connection with FIGS. 6 and 7.

FIG. 5 depicts a conceptual representation of the user programmable timing parameters of the memory system illustrated in FIG. 4. Parameter file 410 contains eight values: TRASMAX, ACT-PRE TIME, PRE-ACT TIME, ACT-R/W TIME, CAS LATENCY, PRECHARGE DELAY TIME, REFRESH INTERVAL, and REFRESH RECOVERY INTERVAL.

$TRAS_{MAX}$ defines the maximum allowable time a page may be open.

ACT-PRE (activate-to-precharge) TIME defines the minimum allowable time a page may be open.

PRE-ACT (precharge-to-activate) TIME defines the minimum time between consecutive PRECHARGE and ACTIVATE commands.

ACT-R/W (activate-to-read/write) TIME defines the minimum time between an activate command and a read or a write command.

CAS LATENCY defines the specific delay which occurs between the a read command and the output of a first beat of data.

PRECHARGE DELAY TIME defines the time which a page remains open after an access to the page.

REFRESH INTERVAL defines the interval between refresh commands to SDRAM 404.

REFRESH RECOVERY INTERVAL defines the minimum time between a refresh command and an activate command.

The manufacturer of SDRAM 404 specifies the values of TRASMAX, ACT-PRE TIME, PRE-ACT TIME, ACT-R/W TIME, CAS LATENCY, REFRESH INTERVAL, and REFRESH RECOVERY INTERVAL necessary to ensure the proper operation of memory system 400. The user of memory system 400 specifies the PRECHARGE DELAY TIME value.

Continuing with the operation of memory system 400, SDRAM controller 402 generally performs three functions with respect to SDRAM 404: refresh, read, and write. SDRAM controller 402 performs refresh operations periodically as a maintenance function of SDRAM 404. The refresh operation causes SDRAM 404 to sense stored values, amplify stored values, and to write the amplified values back into the source bit cells. SDRAM controller 402 performs read and write operations as requested by an external device (not shown). SDRAM controller 402 also has the ability to write values to parameter file 410 to control its operating characteristics. The external device may also have the ability to write new values to parameter file 410. Typically, the various values are written to parameter file 410 when power is first applied to memory system 400. Also, the REFRESH INTERVAL value is loaded into its associated timer in parameter timers 412 in preparation for generating the first refresh command.

In the description that follows, one skilled in the art will readily appreciate that certain timing constraints must be met prior to issuing any command to SDRAM 404. The various timing constraints are defined by the particular values loaded into parameter file 410. It is to be understood that the steps that follow comply with all such timing constraints. The test for these constraints have been omitted from the following FIGS. to more clearly illustrate the present invention.

Figure 6:
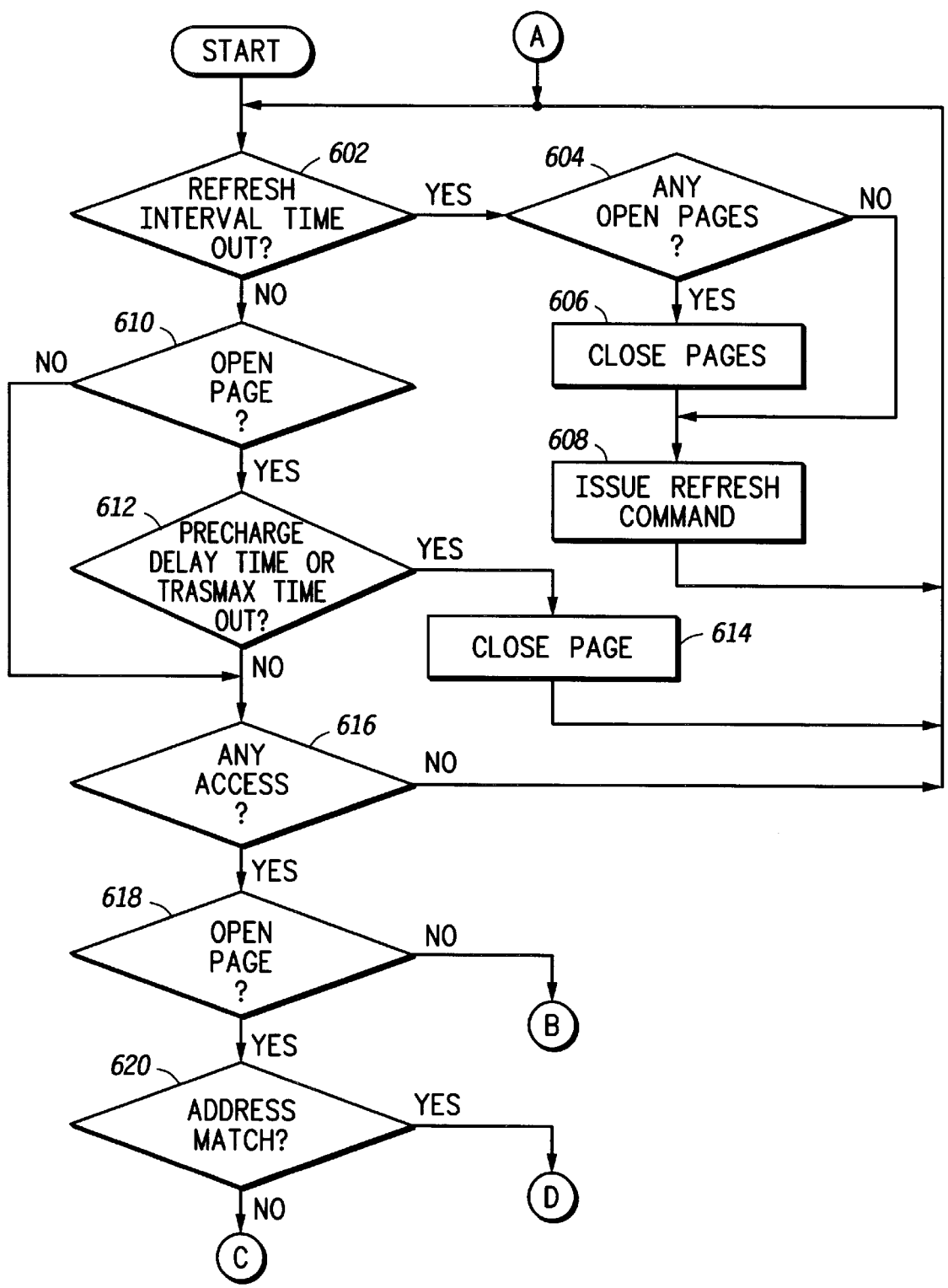
FIG. 6 depicts a flow diagram illustrating the operation of the finite state machine of FIG. 4.

FIG. 6 depicts a flow diagram 600 illustrating the operation of FSM 406 of FIG. 4. A refresh operation is the highest priority operations that FSM 406 performs. Consequently, FSM 406 first determines if the REFRESH INTERVAL has timed out, a step 602. If the REFRESH INTERVAL has timed out, then FSM 406 determines if there are any open pages in SDRAM 404, a step 604. If there is an open page, then FSM 406 closes the page by issuing the PRECHARGE COMMAND, a step 606. After FSM 406 performs step 606, FSM 406 issues a refresh command to SDRAM 404, a step 608. If there were no open pages in step 604, FSM 406 would branch directly to step 608. After step 608, FSM 406 returns to the beginning of flow diagram 600.

If there is no refresh operation to perform in step 602, then FSM 406 determines if there is an open page, a step 610. If there is an open page, then FSM 406 determines if either the PRECHARGE DELAY TIME or the $TRAS_{MAX}$ has timed out, a step 612. If either of these intervals has timed out, then FSM 406 must close the page, a step 614. FSM 406 then returns to the beginning of flow diagram 600. As described above, if PRECHARGE DELAY TIME has timed out, then the user expects a subsequent access to be to a different page. Therefore, it is more efficient to close the page than to keep it open for subsequent access. If $TRAS_{MAX}$ has timed out, then PSM 406 must close the page or risk losing the data stored therein.

If neither PRECHARGE DELAY TIME nor the $TRAS_{MAX}$ has timed out, then FSM 406 determines if there are any read or write access requests, a step 616. If there are no access requests, then FSM 406 returns to the beginning of flow diagram 600. If there is an access to process, then FSM 406 determines if there is an open page, a step 618. If there is no open page, then FSM 406 continues processing in FIG. 7. If there is an open page, then FSM 406 determines if the current access is to the open page, a step 620. FSM 406 maintains the row address of the current open page in address register 408 for this purpose. In either case, FSM 406 continues processing in FIG. 7.

Figure 7:
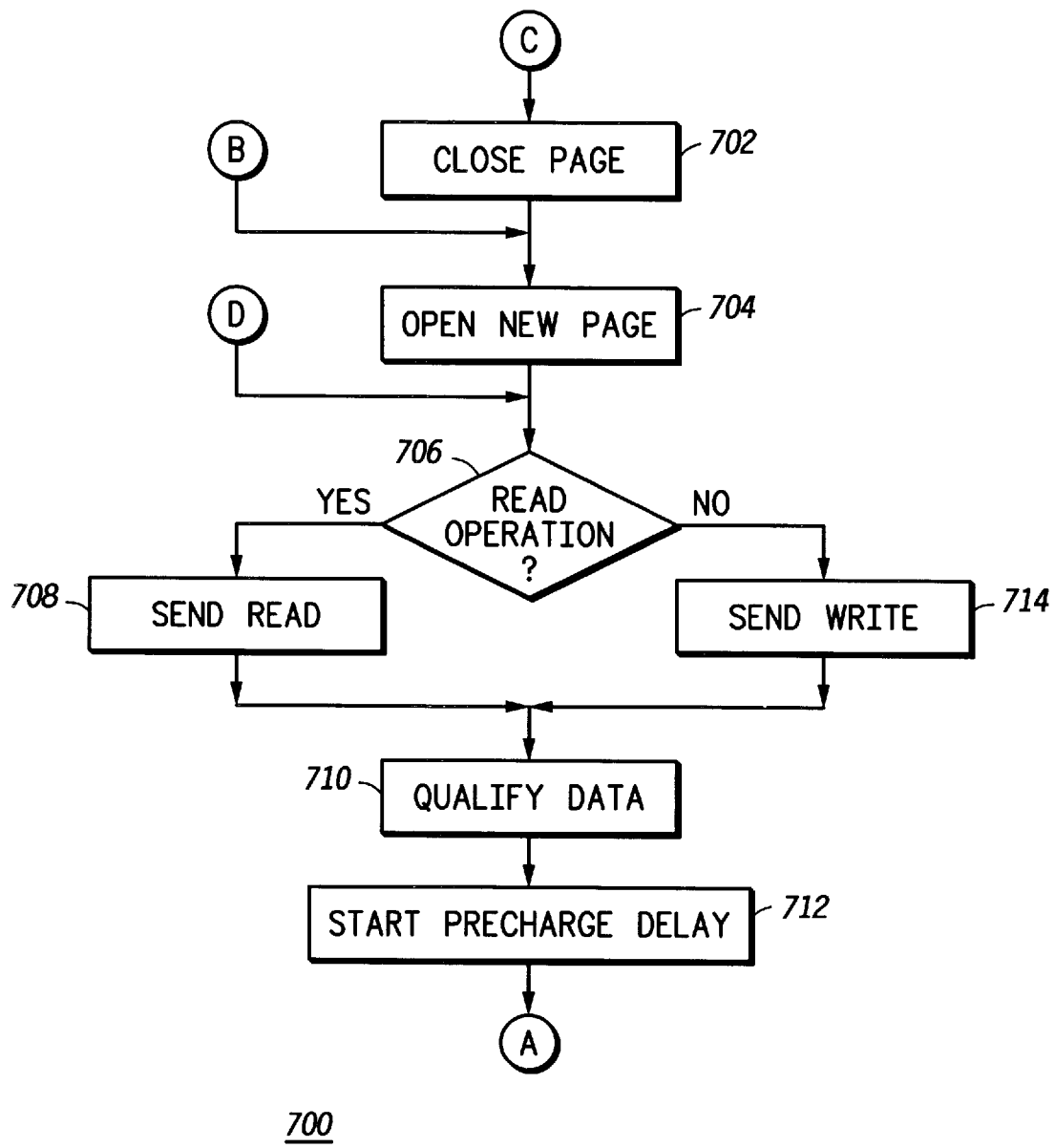
FIG. 7 depicts a continuation of the flow diagram illustrated in FIG. 6.

FIG. 7 depicts a continuation of the flow diagram illustrated in FIG. 6. If the current access is not to the open page, then FSM 406 continues by closing the current page, a step 702. FSM 406 closes the page by issuing a precharge command to SDRAM 404. FSM 406 then opens the new page, a step 704. Step 704 is also the entry point from step 618 if there are no open pages. FSM 406 opens a new page by issuing an activate command with the row address to SDRAM 404. Next, FSM 406 determines if the access is a read operation, a step 706. Step 706 is also the entry point from step 620 if there is an address match.

If the access is a read operation, then FSM 406 issues a read command with the column address to SDRAM 404, a step 708. SDRAM 404 then outputs the data to the requesting device. FSM 406 qualifies the output data as valid data to the requesting device, a step 710. FSM 406 indicates the data's validity by asserting its output DATA VALID. FSM 406 then reloads the timer associated with the PRECHARGE DELAY TIME value, a step 712. FSM 406 returns to returns to the beginning of flow diagram 600.

If the access is not a read operation (a write operation), then FSM 406 issues a write command with the column address to SDRAM 404, a step 714. FSM 406 qualifies the input data as valid data to the requesting device, step 710. FSM 406 continues qualifying the input data so long as there is valid data. FSM 406 then reloads the timer associated with the PRECHARGE DELAY TIME value, the step 712, and returns to returns to the beginning of flow diagram 600.

The foregoing description and illustrations contained herein demonstrate many of the advantages associated with the present invention. In particular, it has been revealed that the disclosed page mode does not suffer the activate-to-read or write delay within a programmable interval. Moreover, the disclosed page mode eliminates precharge-to-activate delays when accesses occur after the programmable interval and are to different pages.

Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is described with respect to an embodiment in which the memory arrays are SDRAMs. However, the invention is applicable to other types of memory systems in which addresses are identified by time-multiplexed schemes. Therefore, the present invention is applicable to conventional memory systems such as fast page mode or extended data out (EDO) DRAMs as well as to future or developing memory systems such as RAMBUS DRAMs (RDRAM) or SLDRAM Consortium DRAMs (SLDRAM). Furthermore, the present invention can be extended to memory architectures in which more than one page may be open at any one time. In these systems, each open page is constrained to a separate portion of the same SDRAM and/or to a separate SDRAM. Each one of these open pages would have associated with it its own precharge delay timer. Therefore, it is intended that this invention encompass all such variations and modifications as fall within the scope of the appended claims.

We claim:

1. A method for controlling a memory device in a page mode, the method comprising:
   during a first interval,
      a step of maintaining a page in an open state (an "open page") to a memory device, a duration of the first interval defined by a user programmable value; and
   during a second interval subsequent to the first interval,
      a step of extending a time in which the page is open, the step of extending responsive to an occurrence of an access to the open page during the first interval, the time in which the page is open responsive to the user programmable value.

2. The method of claim 1 further comprising:
   at a conclusion of the second interval,
      a step of closing the open page.

3. The method of claim 2 further comprising:
   during a third interval subsequent to the first interval,
      a step of closing the open page, wherein the first interval is defined by a maximum Row Address Strobe (RAS) time.

4. The method of claim 2 further comprising:
during a fourth interval subsequent to the first interval,
a step of closing the open page responsive to a refresh operation.

5. The method of claim 2 further comprising:
during a fifth interval subsequent to the first interval,
a step of closing the open page responsive to an access to a page other than open page.

6. The method of claim 1 further comprising:
during a third interval subsequent to the first interval,
a step of closing the open page, wherein the first interval is defined by a maximum Row Address Strobe (RAS) time.

7. The method of claim 1 further comprising:
during a fourth interval subsequent to the first interval,
a step of closing the open page responsive to a refresh operation.

8. The method of claim 1 further comprising:
during a fifth interval subsequent to the first interval,
a step of closing the open page responsive to an access to a page other than open page.

9. An apparatus for controlling a memory device in a page mode comprising:
a user programmable register storing a precharge delay value;
a timer, the timer generating a control signal responsive to an expiration of a first interval, the first interval determined by the precharge delay value; and
a finite state machine, the finite state machine opening a first page in a memory device responsive to a first memory access request, the finite state machine closing the first page responsive to the control signal, the finite state machine resetting the timer responsive to a second memory access, the first memory access and the second memory access being to the first page.

10. The apparatus of claim 9 wherein the finite state machine starts the interval responsive to the first memory access request.

11. The apparatus of claim 10 wherein the finite state machine closes the first page responsive to an expiration of a second interval, the second interval determined by a maximum Row Address Strobe (RAS) time.

12. The apparatus of claim 10 wherein the finite state machine closes the first page responsive to a refresh operation.

13. The apparatus of claim 10 wherein the finite state machine closes the first page responsive to an access to a second page, the second page differing from the first page.

14. The apparatus of claim 9 wherein the finite state machine closes the first page responsive to an expiration of a second interval, the second interval determined by a maximum Row Address Strobe (RAS) time.

15. The apparatus of claim 9 wherein the finite state machine closes the first page responsive to a refresh operation.

16. The apparatus of claim 9 wherein the finite state machine closes the first page responsive to an access to a second page, the second page differing from the first page.

* * * * *